US007340695B2

(12) United States Patent
Durbano et al.

(10) Patent No.: US 7,340,695 B2
(45) Date of Patent: Mar. 4, 2008

(54) REFORMULATION OF THE FINITE-DIFFERENCE TIME-DOMAIN ALGORITHM FOR HARDWARE-BASED ACCELERATORS

(75) Inventors: James P. Durbano, Newark, DE (US); John Humphrey, Newark, DE (US); Fernando E. Ortiz, Newark, DE (US); Dennis W. Prather, Newark, DE (US)

(73) Assignee: EM Photonics, Inc., Newark, DE (US)

( * ) Notice: Subject to any disclaimer, the term of this patent is extended or adjusted under 35 U.S.C. 154(b) by 491 days.

(21) Appl. No.: 11/100,861

(22) Filed: Apr. 7, 2005

(65) Prior Publication Data

US 2005/0273479 A1    Dec. 8, 2005

Related U.S. Application Data

(60) Provisional application No. 60/560,546, filed on Apr. 8, 2004.

(51) Int. Cl.
     *G06F 17/50*      (2006.01)
(52) U.S. Cl. ............................................. 716/1; 716/6
(58) Field of Classification Search ............... 716/1, 716/2, 6, 18
See application file for complete search history.

(56) References Cited

U.S. PATENT DOCUMENTS

2004/0225483 A1*   11/2004   Okoniewski et al. .......... 703/2

OTHER PUBLICATIONS

K.S. Kunz et al., *The Finite Difference Time Domain Method for Electromagnetics*. CRC Press (1993).

J.P. Berenger, "Three-Dimensional Perfectly Matched Layer for the Absorption of Electromagnetic Waves," *Journal of Computational Physics*, vol. 127, pp. 363-379, Article No. 181 (1996).
N.N. Rao, *Elements of Engineering Electromagnetics* (Fourth Edition), Prentice Hall, Englewood Cliffs, New Jersey (1999).
A. Taflove et al., *Computational electrodynamics: the finite-difference time-domain method*, 2nd Ed., Artech House, Inc. , Northwood, MA (2000).
M.N.O. Sadiku, *Numerical techniques in electromagnetics*, CRC Press, Inc., Boca Raton: (2001).
P. Placidi et al., "A Custom VLSI Architecture for the Solution of FDTD Equations," *IEICE Transactions on Electronics*, vol. E85-C, pp. 572-577, No. 3 (Mar. 2002).
R.N. Schneider et al., "Application of FPGA Technology to Accelerate the Finite-Difference Time-Domain (FDTD) Method," presented at The Tenth ACM International Symposium on Field-Programmable Gate Arrays, Monterey, CA (2002).
J.P. Durbano et al., "Hardware Acceleration of the 3D Finite-Difference Time-Domain Method," *IEEE Antennas and Wireless Propagation Letters*, vol. 2, pp. 54-57, 2003.

(Continued)

*Primary Examiner*—Thuan Do
(74) *Attorney, Agent, or Firm*—Connolly Bove Lodge & Hutz LLP

(57) ABSTRACT

A hardware-based acceleration platform for computational electromagnetic algorithms, specifically the finite-difference time-domain ("FDTD") method, comprises reformulating the FDTD algorithm in order to make it more hardware friendly. This reformulation makes use of split fields at every node in the mesh, and combines total- and scattered-field formulations into a single, hybrid formulation. By precomputing coefficients for the nodes in the mesh, it is possible for a single set of equations to support plane waves, point sources, PML ABCs, and PEC walls. In the method sources are determined by means of a lookup table, rather than through direct hardware computations. All of these modifications enable the hardware designer to much more easily develop an FDTD accelerator.

15 Claims, 1 Drawing Sheet

OTHER PUBLICATIONS

W. Chen et al., "An FPGA Implementation of the Two Dimensional Finite-Difference Time-Domain (FDTD) Algorithm," presented at The Twelfth ACM International Symposium on Field-Programmable Gate Arrays (FPGA) (2004).

* cited by examiner

REFORMULATION OF THE FINITE-DIFFERENCE TIME-DOMAIN ALGORITHM FOR HARDWARE-BASED ACCELERATORS

CLAIM FOR PRIORITY

The present application claims priority of U.S. Provisional Patent Application Ser. No. 60/560,546, filed Apr. 8, 2004, the disclosure of which being incorporated by reference herein in its entirety.

BACKGROUND OF THE INVENTION

A. Field of the Invention

The present invention relates generally to hardware-based accelerators, and, more particularly to reformulation of the finite-difference time-domain ("FDTD") algorithm for hardware-based accelerators.

B. Description of the Related Art

Although the importance of fast, accurate computational electromagnetic (CEM) solvers is readily apparent, how to construct them is not. CEM algorithms are, by nature, both computationally and memory intensive. Furthermore, the serial nature of most software-based implementations does not take advantage of the inherent parallelism found in many CEM algorithms. In an attempt to exploit this parallelism, supercomputers and computer clusters are employed. However, these solutions can be prohibitively expensive and frequently impractical. Thus, a CEM accelerator would provide the community with much-needed processing power. This would enable iterative designs and permit the analysis of designs that would otherwise be impractical to characterize.

CEM algorithms, such as the FDTD method, contain distinct regions of operation, including the normal FDTD space, an absorbing boundary region, and the incident source condition. These regions are easily accounted for in a software-based implementation. However, the incorporation of multiple regions into a hardware-based accelerator is a non-trivial task, as it requires logic replication and decision-making, both of which can increase area and necessitate a slower clock rate.

Thus, there is a need in the art for a hardware-enabling 3D reformulation of the FDTD algorithm.

SUMMARY OF THE INVENTION

The present invention solves the problems of the related art by providing a 3D reformulation of the FDTD algorithm for hardware-based accelerators. The reformulation of the present invention is a hybrid, combining aspects of scattered-field formulations with those of total-field formulations. This implementation allows a single equation form to be applied at every node, including source and boundary nodes, facilitating the implementation of a 3D hardware accelerator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EMBODIMENTS OF THE INVENTION

Figure 1:
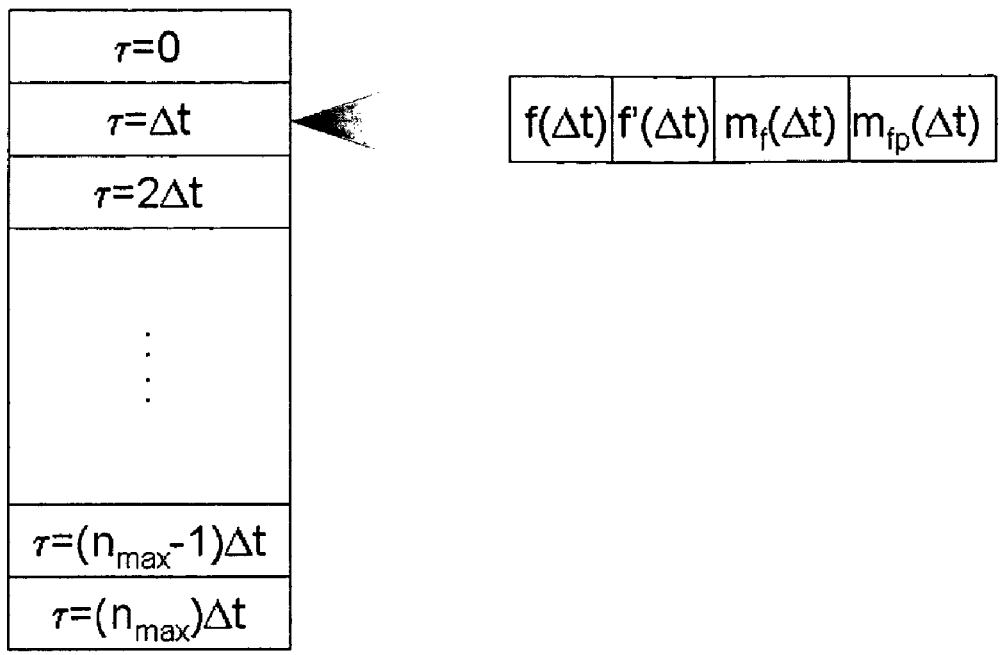
FIG. 1 is a schematic showing the layout of the source lookup table, wherein two r values are entered and the corresponding column values are outputted to determine the necessary values.

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

A. Introduction

The present invention may best be seen by first providing a brief description of the attributes that characterize an algorithm as suitable for hardware implementation. Next, the details of the reformulation of the present invention are described. Specifically, the reformulated field-update equations are described, along with how absorbing boundary and incident source conditions are implemented. The description concludes with a brief description of our hardware-based FDTD accelerator and the results obtained with the system. The system of the present invention enables throughputs that rival 90-node personal computer ("PC") clusters.

B. Developing a Hardware Friendly FDTD Formulation

Although hardware acceleration has been successfully demonstrated for many different applications, not every algorithm, including the FDTD method, lends itself to a direct, efficient hardware implementation. This is primarily due to the differences between the microprocessor-based software platform and the application-specific hardware platform. Overcoming this problem requires that the FDTD algorithm be modified to make it "hardware friendly." This section highlights the differences between the software and hardware platforms, and describes how a software-based algorithm can be converted into a hardware-friendly algorithm.

Software programs are run on computers with underlying microprocessors. These microprocessors are capable of performing many different types of operations and can be used to solve a variety of problems. The tradeoff for the generality of microprocessors is their speed. Although many microprocessors can be clocked in the gigahertz (GHz) range, various overheads associated with executing instructions and fetching data limit the overall throughput of the system. Application-specific hardware replaces the generality of microprocessors with a customized architecture, capable of solving a more limited range of problems. For example, a problem in which numerous additions and multiplications need to be performed, such as the FDTD method, could benefit from a hardware platform that contained several arithmetic units. Although the maximum parallelism exploited by a microprocessor is limited by the number of functional units contained within it, application-specific hardware can prepare for the high computational demand and exploit the parallelism inherent to the problem by including multiple arithmetic units.

To better understand how a software-based algorithm can be transformed into a hardware friendly algorithm, consider the following example. Assume that one wishes to calculate 'A' subject to the following rules:

```
if (in region 1)
    A = B * C + D
else if (in region 2)
    A = B * C - D
else if (in region 3)
    A = B * C
end if
```

A direct hardware implementation would involve building three different 'A' computation units, along with region detection logic, both of which could require tremendous amounts of chip area.

A hardware friendly algorithm would take the form:

$$A=B*C+E*D,$$

where E=1, −1, or 0 depending upon the region. In this case, we have increased the amount of data we need to store (namely the coefficient 'E') and added a multiplication unit. This allows elimination of the conditional "if" structure and three different versions of the equation in hardware. Note that this additional multiplication has not increased the latency of the calculation of 'A', as the new multiplication can be performed in parallel with the 'B*C' operation. In addition to the data increase, we have also introduced a new complexity. Namely, we must generate the values of the coefficient 'E' for the different regions. However, this complexity can be handled by a front-end PC that initially downloads the values of 'E' for different locations. Simply put, we have off-loaded the portion of the problem that PCs do well, decision making, and taken advantage of what hardware does well, repetitive computational tasks. Although this is an overly simplified example, it illustrates how increased data requirements can offset increased logic requirements.

It is also important to note how this simple modification has enabled more parallelism. In the three-region example described above, logic for three different computations of 'A' would need to be implemented. The appropriate computation path could then be selected based on the current region of operation. Thus, although hardware for all three computations would be implemented, only one path would be used. By replacing these three unique 'A' computation paths with a single, hardware friendly "general" equation, we reduce the area required to perform the same task. Furthermore, because we have reduced the area requirements, it is possible to replicate this general equation and exploit parallelism.

C. The Hybrid Field-Update Equations

As shown in the previous section, a single generalized equation, rather than multiple equations for different regions, is preferred for the hardware-based implementations of algorithms. To this end, the initial goal of the reformulation of the present invention was to combine multiple, disjoint equations into a single equation applicable to every node in the mesh. This section describes the hardware friendly reformulation of the FDTD method of the present invention. The section begins with a presentation of the standard formulation, and then shows how the reformulated equations were derived from the total- and scattered-field formulations.

In a standard FDTD formulation, based on the Yee cell, and assuming an isotropic, nonmagnetic media and a constant spatial step size, the FDTD equations have the following general form of Equation (1):

$$E_x^n(i,j,k)=A(m)E_x^{n-1}(i,j,k)+B(m)[H_z^{n-1}(i,j,k)-H_z^{n-1}(i,j-1,k)-H_y^{n-1}(i,j,k)+H_y^{n-1}(i,j,k-1)]$$

$$H_x^n(i,j,k)=H_x^{n-1}(i,j,k)+C(m)[E_y^{n-1}(i,j,k+1)-E_y^{n-1}(i,j,k)-E_z^{n-1}(i,j+1,k)+E_z^{n-1}(i,j,k)] \quad (1)$$

where A, B, and C are coefficients based on problem-specific data, such as the material properties of the object under test. Note that there are actually six equations that are required: one pair for each Cartesian direction. For brevity, an equation for one Cartesian direction is shown to provide a general form.

Although these equations can be used to compute the fields in a standard mesh, they do not account for absorbing boundary conditions (ABCs) nor the introduction of a source field. The handling of ABCs and source conditions each require another set of equations to be evaluated. In the case of Perfectly Matched Layer (PML) ABCs, six more equations may be needed in the absorbing region, as each field component is split into two components, as shown in Equation (2). For example, the x-directed electric field component is composed of two split fields:

$$E_x=E_{xy}+E_{xz}. \quad (2)$$

Introduction of the source fields, whether they be incident plane waves (e.g., scattering problems) or point sources (e.g., radiation problems), requires unique equations, both to describe the nature of the wave and to incorporate these values into the field-update computations. Thus, the exact form of the equations to evaluate will vary among different problems with unique source configurations and even within the same problem depending on the solution region (e.g., source vs. non-source nodes). While this poses little difficulty in a pure software approach, it is problematic for hardware implementations, as described above. Thus, the goal of a hardware friendly FDTD implementation is to derive a general set of FDTD equations applicable to the greatest number of possible problems. The details of the hardware friendly approach of the present invention are now presented.

First, the fields at all nodes in the mesh are split into two subfields. This is a departure from the standard formulation that makes use of split-fields only in the PML regions. By splitting the fields at every node in the mesh, the same set of equations is applicable at both general and PML ABC nodes. This eliminates the need for additional logic to detect which type of node is currently being updated, along with the logic required to implement two unique sets of equations, one for general nodes and the other for boundary nodes. This modification comes at the expense of increased memory requirements, which exacerbate the memory bandwidth bottleneck.

Next, we desire a single set of equations that will allow for the solution of both scattering and radiation problems. Typically, one would utilize a total-field formulation for radiation problems and a scattered-field formulation for scattering problems. Another common approach is to combine the two methods into a total/scattered-field formulation, which introduces the concept of a connecting boundary condition. However, a connecting boundary represents a "unique" area of calculation. Because the goal is a single set of equations applicable at every node, our approach is to implement a set of general equations that can be switched from a pure total-field formulation to a pure scattered-field formulation by simply varying coefficients. For reference, a subset of the equations from both total- and scattered-field formulations are shown in Equations (3) and (4), respectively.

$$E_{xy}^n(i,j,k) = A_1(i,j,k)E_{xy}^{n-1}(i,j,k) + \quad (3)$$
$$A_2(i,j,k)[H_{zx}^{n-1}(i,j,k) - H_{zx}^{n-1}(i,j-1,k)] +$$
$$A_2(i,j,k)[H_{zy}^{n-1}(i,j,k) - H_{zy}^{n-1}(i,j-1,k)]$$
$$H_{xy}^n(i,j,k) = H_{xy}^{n-1}(i,j,k) +$$
$$A_3(i,j,k)[E_{zx}^{n-1}(i,j+1,k) - E_{zx}^{n-1}(i,j,k)] +$$
$$A_3(i,j,k)[E_{zy}^{n-1}(i,j+1,k) - E_{zy}^{n-1}(i,j,k)]$$

$$E_{xy}^n(i,j,k) = B_1(i,j,k)E_{xy}^{n-1}(i,j,k) - B_2(i,j,k)E_{inc}^n(i,j,k) - \quad (4)$$
$$B_3(i,j,k)\frac{\partial E_{inc}^n(i,j,k)}{\partial t} +$$
$$B_4(i,j,k)[H_{zx}^{n-1}(i,j,k) - H_{zx}^{n-1}(i,j-1,k)] +$$
$$B_4(i,j,k)[H_{zy}^{n-1}(i,j,k) - H_{zy}^{n-1}(i,j-1,k)]$$
$$H_{xy}^n(i,j,k) = H_{xy}^{n-1}(i,j,k) -$$
$$B_5(i,j,k)[E_{zx}^{n-1}(i,j+1,k) - E_{zx}^{n-1}(i,j,k)] +$$
$$B_5(i,j,k)[E_{zy}^{n-1}(i,j+1,k) - E_{zy}^{n-1}(i,j,k)]$$

Because the total- and scattered-field formulations have similar structures, it is possible to represent both formulations with a single set of equations. Specifically, the scattered-field formulation has the exact structure as the total-field formulation, with the exception of the two source field terms. Thus, one form of the equations is required for the total-field formulation (e.g., without the source terms) and another is required for the scattered-field formulation (e.g., with the source terms). As described earlier, it is possible to replace these logic dependencies with data dependencies. That is, $B_2$ and $B_3$ can be set to 0 when working with a total-field formulation. Simply varying the coefficients between problem types allows the generalized set of equations, shown in Equation (5), to reduce to either a total- or scattered-field formulation.

$$E_{xy}^n(i,j,k) = C_1(i,j,k)E_{xy}^{n-1}(i,j,k) - C_2(i,j,k)E_{inc}^n(i,j,k) - \quad (5)$$
$$C_3(i,j,k)\frac{\partial E_{inc}^n(i,j,k)}{\partial t} +$$
$$C_4(i,j,k)[H_{zx}^{n-1}(i,j,k) - H_{zx}^{n-1}(i,j-1,k)] +$$
$$C_4(i,j,k)[H_{zy}^{n-1}(i,j,k) - H_{zy}^{n-1}(i,j-1,k)]$$
$$H_{xy}^n(i,j,k) = H_{xy}^{n-1}(i,j,k) -$$
$$C_5(i,j,k)[E_{zx}^{n-1}(i,j+1,k) - E_{zx}^{n-1}(i,j,k)] +$$
$$C_5(i,j,k)[E_{zy}^{n-1}(i,j+1,k) - E_{zy}^{n-1}(i,j,k)].$$

Depending on the desired formulation, coefficients can be "zeroed" out or modified, thus permitting both the total- and scattered-field formulations to be represented with a single set of equations. The values of the coefficients for these formulations are provided in Table 1. Table 1 shows coefficient values for the reformulated FDTD equations. This table contains the coefficient values for the equations shown in Equation (5). By choosing the appropriate values for the coefficients, it is possible for a single set of equations to solve both radiation and scattering problems.

TABLE 1

| | Scattered-Field Formulation | Total-Field Formulation |
|---|---|---|
| $C_1(i,j,k)$ | $\dfrac{\varepsilon_o\varepsilon_y(i,j,k)}{(\varepsilon_o\varepsilon_y(i,j,k) + \sigma_y(i,j,k)\Delta t)}$ | |
| $C_2(i,j,k)$ | $\dfrac{\varepsilon_o(\varepsilon_y(i,j,k) - 1)\Delta t}{(\varepsilon_o\varepsilon_y(i,j,k) + \sigma_y(i,j,k)\Delta t)}$ (0 for background material) | 1 at source location 0 other locations |
| $C_3(i,j,k)$ | $\dfrac{\sigma_y(i,j,k)\Delta t}{(\varepsilon_o\varepsilon_y(i,j,k) + \sigma_y(i,j,k)\Delta t)}$ (0 for background material) | 0 |
| $C_4(i,j,k)$ | $\dfrac{\Delta t}{\Delta y(\varepsilon_o\varepsilon_y(i,j,k) + \sigma_y(i,j,k)\Delta t)}$ | |
| $C_5(i,j,k)$ | $\dfrac{\Delta t}{\mu_o \Delta y}$ | |

In this table, $\varepsilon_0$ and $\mu_0$ are the permittivity and permeability, respectively, of free-space, $\varepsilon_y(i,j,k)$ is the relative permittivity in the y-direction at grid location (i,j,k), $\Delta t$ denotes the temporal step size, and $\Delta y$ denotes the spatial step size. In general, each of these coefficients, as well as those coefficients needed for the other ten split-field FDTD equations, must be stored at every node in the FDTD grid. For large problems, this results in an impractical amount of memory storage. For example, a relatively small problem with only 10 million nodes requires more than a gigabyte of storage for coefficients, as shown in Equation (6).

$$\frac{4 \text{ bytes}}{\text{coefficient}} * \frac{5 \text{ coefficients}}{\text{equation pair}} * \quad (6)$$
$$\frac{6 \text{ equation pairs}}{\text{node}} * \frac{10 \text{ million nodes}}{\text{problem}} > 1 \text{ GB}$$

To reduce the amount of memory required, we have implemented a material lookup table. In this approach, the number of allowable materials is restricted to some finite, but practical, number (currently 64), and each material type is given a unique integer identification ("ID"). Using this approach, we now need to store only the material ID as seen along the x, y, and z axes for each node in the mesh, rather than store all of the various coefficients. This results in a significant reduction in memory requirements.

Thus, Equation (5) can be rewritten as:

$$E_{xy}^n(i,j,k) = C_1(m_y(i,j,k))E_{xy}^{n-1}(i,j,k) - C_2(m_y(i,j,k)) \quad (7)$$
$$E_{inc}^n(i,j,k) - C_3(m_y(i,j,k))\frac{\partial E_{inc}^n(i,j,k)}{\partial t} +$$
$$C_4(m_y(i,j,k))[H_{zx}^{n-1}(i,j,k) - H_{zx}^{n-1}(i,j-1,k)] +$$
$$C_4(m_y(i,j,k))[H_{zy}^{n-1}(i,j,k) - H_{zy}^{n-1}(i,j-1,k)]$$

-continued $$H_{xy}^n(i, j, k) = H_{xy}^{n-1}(i, j, k) -$$
$$C_5(m_y(i, j, k))[E_{zx}^{n-1}(i, j+1, k) - E_{zx}^{n-1}(i, j, k)] +$$
$$C_5(m_y(i, j, k))[E_{zy}^{n-1}(i, j+1, k) - E_{zy}^{n-1}(i, j, k)],$$

where $m_y(i,j,k)$ is a small integer representing the material type looking in the y direction at grid location (i,j,k).

D. Implementation of Sources

The last component of the reformulation to discuss is the introduction of sources. For scattering problems, both the source value and its temporal derivative are required to correctly update the electromagnetic fields. Unfortunately, defining electromagnetic sources poses yet another difficulty for hardware implementations of the FDTD method. To better understand the complexity of hardware-based source implementations, a brief overview of source computations is provided below.

Sources, whether plane waves, beams, or local sources (e.g., point, current, and voltage sources), can generally be represented as a function of both position and time. The general form of a source wave traveling in the $\hat{\beta}$ direction can be expressed as Equation (8):

$$\vec{E}(\vec{r}, t) = E_0 \cos(\omega t - \vec{\beta} \cdot \vec{r} + \phi) \cdot w(\vec{r}, t) \tag{8}$$

Here, $E_0$ is the amplitude of the wave, w is a windowing function that could, in general, be both spatially and temporally varying, and the cosine term represents the oscillating portion of the wave, with ω representing the oscillating frequency. Examining the other wave components, $\vec{r}$ is the position vector from the source to the given location, t is time, $\vec{\beta}$ is the propagation vector, and $\phi$ represents a phase shift.

We can simplify the cosine term by defining a value $\bar{\tau}$ as follows:

$$\cos(\omega t - \vec{\beta} \cdot \vec{r} + \phi) = \cos\left(\omega\left(t - \frac{\vec{\beta} \cdot \vec{r}}{\omega}\right) + \phi\right) \tag{9}$$
$$= \cos\left[\omega\left(t - \frac{\left(\frac{\omega}{v}\hat{\beta}\right) \cdot \vec{r}}{\omega}\right) + \phi\right]$$
$$= \cos\left(\omega\left(t - \frac{|\vec{r}|}{v}\right) + \phi\right)$$
$$= \cos(\omega|\bar{\tau}| + \phi),$$

leaving us with an equation of the form:

$$\vec{E}(\vec{r},t) = E_0 \cos(\omega\bar{\tau} + \phi) \cdot w(\bar{\tau}). \tag{10}$$

Thus, a hardware-based FDTD solver must be able to solve equations of the general form shown in Equation (10). As a more specific example, consider a Gaussian windowed plane wave of amplitude $E_0$:

$$\vec{E}(\vec{r},t) = E_0 \cos(\omega\bar{\tau}) \exp(-\alpha\bar{\tau}^2), \tag{11}$$

where α, defined by $\alpha=(4v/r)^2$, dictates the bandwidth of the Gaussian modulated pulse.

A direct hardware implementation of this simple (and common) source distribution requires a large number of gates to account for both the cosine and exp terms, reducing the resources available for other operations. Rather than implement the source directly in hardware, our reformulation utilizes a source lookup table ("LUT"), which provides two main advantages. First, it eliminates the need to explicitly implement many different types of functions, such as cosine and exponential, in hardware. In addition to saving logic gates, this approach also reduces the computational time. Thus, rather than wait for the hardware logic to compute the given function, the values are simply fetched from a table and interpolated (if necessary). The second advantage of this approach is that it allows the hardware to support non-standard sources. Thus, any type of time-dependent source that can be stored in a lookup table can be implemented in hardware. The details of the source LUT, for both plane waves and point sources, are now discussed.

1. Plane Wave Sources

We begin with a description of how plane wave sources are implemented in the LUT approach. For simplicity, consider a uniform plane wave, which can be written as:

$$\vec{E}(\vec{r},t) = \vec{A} \cdot f(\tau), \tag{12}$$

where f is the cosine function from above, $\vec{A}=A_x\hat{x}+A_y\hat{y}+A_z\hat{z}$, with $A_x$, $A_y$, and $A_z$ representing the amplitudes of the vector components, and $\vec{r}$ is a distance vector, indicating the distance from a reference location. The distance vector $\vec{r}$ must be defined (or calculated) at each node in the mesh. Once $\vec{r}$ is known, $\bar{\tau}$ can be calculated as follows (by expanding $\bar{\tau}$ into its vector components):

$$\tau_x = t - \frac{r_x}{v}, \tau_y = t - \frac{r_y}{v}, \tau_z = t - \frac{r_z}{v}, \tag{13}$$

where $t=n\Delta t$ (n=current timestep, Δt=temporal step size), and the r values are the magnitudes of $\vec{r}$ in the x, y, and z directions.

Recall that both the source function and its temporal derivative are required by the scattered-field formulation. The values of both f (τ) and f' (τ) are stored in a problem-specific, precomputed lookup table that lists the incident field components as a function of τ. For any τ values not explicitly listed in the table, f (τ) and f' (τ) can be computed using a linear interpolation, given by:

$$f(\tau) = f(\tau_1) + \Delta\tau\left[\frac{f(\tau_2) - f(\tau_1)}{\tau_2 - \tau_1}\right] \tag{14}$$
$$= f(\tau_1) + \Delta\tau \cdot m_f, \tau > 0$$
$$f'(\tau) = f'(\tau_1) + \Delta\tau\left[\frac{f'(\tau_2) - f'(\tau_1)}{\tau_2 - \tau_1}\right]$$
$$= f'(\tau_1) + \Delta\tau \cdot m_{fp}, \tau > 0.$$
$$f(\tau) = f'(\tau) = 0, \tau \leq 0$$

Figure 2:
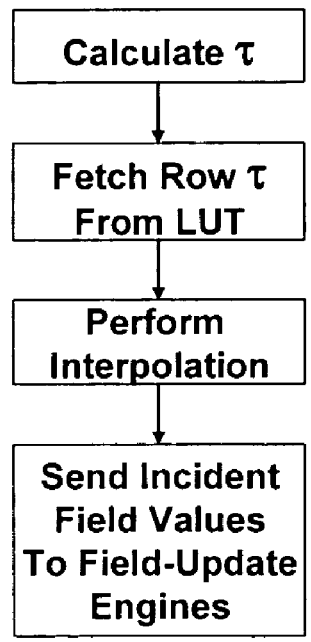
FIG. 2 is a source computation flowchart that shows the steps involved in determining the incident field values required to update the electromagnetic fields.

In these equations, $\tau_1$ and $\tau_2$ correspond to values of τ for which f (τ) and f' (τ) have been precomputed and stored in adjacent locations in the lookup table, with $\tau_1 \leq \tau < \tau_2$ and $\Delta\tau = \tau - \tau_1$. The table is indexed by values of τ between 0 and $n_{max}\Delta t$, where $n_{max}$ is the number of timesteps to be computed. The layout of this table is show in FIG. 1. The last two variables to describe are $m_f$ and $m_{fp}$, which represent the slopes of f (τ) and f' (τ), respectively, between adjacent rows in the table. These values are necessary in order to perform the linear interpolation on the source values. Because the slopes remain constant between adjacent rows throughout the problem, storing the slopes, rather than computing them each time, saves both the logic that would be required to implement the mathematical operations and the time required to calculate them. The overall flow of the source computation is shown in FIG. 2.

2. Point Sources

The implementation of point sources follows the same general form as plane waves. A point source can be represented as:

$$\bar{E}(\bar{d}_o,t)=\bar{A}\cdot f(t). \quad (15)$$

Because a point source is defined at a single location, Equation (15) can be determined by substituting $\bar{r}=0$ into Equation (12).

In the current architecture, point sources are implemented using the hardware lookup table described above. However, when working with point sources, three of the four columns in the table are filled with zeros. The reduction to a single column LUT arises for two reasons. First, when working with point sources, the algorithm transforms into a total-field formulation, which does not utilize the temporal derivatives. Thus, the two columns related to the temporal derivatives (f'($\tau$) and $m_{fp}$) are not required. Second, recall that the LUT has an entry for every possible n$\Delta$t (timestep) value. Because a point source is defined at a single location and the LUT has an entry for every timestep, it is possible to precisely compute the source values at every timestep, thus eliminating the need for interpolation (and the $m_f$ column).

Although interpolation is not required for point sources, the interpolation hardware is still used. However, because three of the four columns in the source LUT are filled with zeros, the result of the interpolation computation is the same as if the interpolation had never been performed. Although this may seem inefficient, it is much easier to use the exact same hardware and control logic rather that introduce decision making, as described earlier.

In this section, we briefly described the difficulty of implementing sources directly in hardware by means of mathematical function blocks. We then described how a lookup table approach overcomes these difficulties and provides a general-purpose solution, applicable to many types of sources, including both plane waves and point sources. This allowed for the development of a single, optimized source computation unit capable of solving many types of sources.

E. Conclusion

The goal of the present invention was to develop a hardware-based acceleration platform for CEM algorithms, specifically the FDTD method. To this end, it was necessary to reformulate the FDTD algorithm in order to make it more hardware friendly. This reformulation makes use of split fields at every node in the mesh, not just the absorbing boundaries, and combines total- and scattered-field formulations into a single, hybrid formulation. By precomputing coefficients for the nodes in the mesh, it is possible for a single set of equations to support plane waves, point sources, PML ABCs, and PEC walls. We also described how sources are determined by means of a lookup table, rather than through direct hardware computations. All of these modifications enable the hardware designer to much more easily develop an FDTD accelerator.

It will be apparent to those skilled in the art that various modifications and variations can be made in the reformulation of the finite-difference time-domain ("FDTD") algorithm for hardware-based accelerators of the present invention and in construction of the accelerators without departing from the scope or spirit of the invention, examples of which have been previously provided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of reformulating the finite-difference time-domain algorithm for hardware-based accelerators, comprising:
    splitting fields at every node in a mesh into two subfields;
    combining total-field and scattered-field formulations into a single, hybrid formulation; and
    determining sources for updating split fields by means of a lookup table, rather than through direct hardware computations.

2. A method of reformulating the finite-difference time-domain algorithm for hardware-based accelerators as recited in claim 1, wherein the reformulated algorithm supports plane waves, point sources, PML ABCs, and PEG walls.

3. A method of reformulating the finite-difference time-domain algorithm for hardware-based accelerators as recited in claim 1, wherein the combining total-field and scattered-field formulations into a single, hybrid formulation step comprises implementing a set of general equations that are capable of being switched from a total-field formulation to a scattered-field formulation by varying coefficients.

4. A method of reformulating the finite-difference time-domain algorithm for hardware-based accelerators as recited in claim 1, further comprising implementing a material lookup table.

5. A method of reformulating the finite-difference time-domain algorithm for hardware-based accelerators as recited in claim 4, wherein the implementing the material lookup table comprises restricting the number of allowable materials to a predetermined number, and providing each material type a unique integer identification.

6. A method of reformulating the finite-difference time-domain algorithm for hardware-based accelerators as recited in claim 5, wherein the predetermined number is sixty-four.

7. A method of reformulating the finite-difference time-domain algorithm for hardware-based accelerators as recited in claim 1, wherein the determining sources by means of a lookup table step eliminates the need to implement different types of functions in hardware which saves logic gates and reduces computational time.

8. A method of reformulating the finite-difference time-domain algorithm for hardware-based accelerators as recited in claim 1, wherein the determining sources by means of a lookup table step allows the hardware to support non-standard sources, permitting any type of time-dependent source that can be stored in a lookup table to be implemented in hardware.

9. A hardware-based accelerator comprising a reformulated finite-difference time-domain algorithm, wherein the reformulated finite-difference time-domain algorithm includes:
    split fields at every node in a mesh into two subfields;
    a single, hybrid formulation that combines total-field and scattered-field formulations; and
    a lookup table for determining sources for updating split fields rather than through direct hardware computations.

10. A hardware-based accelerator as recited in claim 9, wherein the reformulated algorithm supports plane waves, point sources, PML ABCs, and PEC walls.

11. A hardware-based accelerator as recited in claim 9, wherein the single, hybrid formulation step comprises a set of general equations that are capable of being switched from a total-field formulation to a scattered-field formulation by varying coefficients.

12. A hardware-based accelerator as recited in claim 9, wherein the reformulated algorithm further comprises a material lookup table.

13. A hardware-based accelerator as recited in claim 12, wherein the material lookup table restricts the number of allowable materials to a predetermined number, and provides each material type a unique integer identification.

14. A hardware-based accelerator as recited in claim 9, wherein the lookup table eliminates the need to implement different types of functions in hardware which saves logic gates and reduces computational time.

15. A hardware-based accelerator as recited in claim 9, wherein the lookup table allows the hardware to support non-standard sources, permitting any type of time-dependent source that can be stored in a lookup table to be implemented in hardware.

* * * * *

UNITED STATES PATENT AND TRADEMARK OFFICE
CERTIFICATE OF CORRECTION

| | | |
|---|---|---|
| PATENT NO. | : 7,340,695 B2 | Page 1 of 1 |
| APPLICATION NO. | : 11/100861 | |
| DATED | : March 4, 2008 | |
| INVENTOR(S) | : James P. Durbano et al. | |

It is certified that error appears in the above-identified patent and that said Letters Patent is hereby corrected as shown below:

Following col. 1, line 11, please insert the following new heading and paragraph:

-- STATEMENT REGARDING FEDERALLY-SPONSORED RESEARCH
OR DEVELOPMENT

This invention was made with Government support under Contract No. DAAH-01-03-C-R214, awarded by U.S. Army Aviation and Missile Command. The Government has certain rights in the invention. --

Signed and Sealed this
Seventeenth Day of April, 2012

David J. Kappos
*Director of the United States Patent and Trademark Office*